(12) United States Patent
Hester et al.

(10) Patent No.: US 7,746,123 B2
(45) Date of Patent: Jun. 29, 2010

(54) SWITCHING SYSTEM WITH REDUCED EMI

(75) Inventors: Richard Knight Hester, McKinney, TX (US); Patrick Peter Siniscalchi, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 3 days.

(21) Appl. No.: 12/206,905

(22) Filed: Sep. 9, 2008

(65) Prior Publication Data

US 2010/0060340 A1    Mar. 11, 2010

(51) Int. Cl.
*H03K 3/00* (2006.01)
(52) U.S. Cl. ............. 327/108; 327/170; 327/423; 327/588; 326/87
(58) Field of Classification Search ............ 327/108, 327/170, 423, 588; 326/87
See application file for complete search history.

(56) References Cited

U.S. PATENT DOCUMENTS 5,483,188 A * 1/1996 Frodsham ............... 327/170
5,825,219 A * 10/1998 Tsai ...................... 327/112
7,176,743 B2 * 2/2007 Leonowich et al. ........ 327/423
7,190,224 B2   3/2007 Sutardja
7,242,248 B1   7/2007 Sutardja
7,298,209 B1   11/2007 Sutardja

* cited by examiner

*Primary Examiner*—Kenneth B. Wells
(74) *Attorney, Agent, or Firm*—John J. Patti; Wade J. Brady, III; Frederick J. Telecky, Jr.

(57) ABSTRACT

Various apparatuses, methods and systems for switched mode electronic circuits with reduced EMI are disclosed herein. For example, some embodiments of the present invention provide apparatuses including a power supply, an output, and a composite switch connected between the power supply and the output. The composite switch includes a plurality of transistors connected in parallel, a switch closing delay line having a plurality of switch closing outputs each connected to a control input of one of the plurality of transistors, and a switch opening delay line having a plurality of switch opening outputs each connected to one of the plurality of switch closing outputs. The switch closing delay line and switch opening delay line are connected in an order that opens the plurality of transistors in a staggered order in time and closes the plurality of transistors in a reverse staggered order in time.

19 Claims, 6 Drawing Sheets

SWITCHING SYSTEM WITH REDUCED EMI

BACKGROUND OF THE INVENTION

The present invention is related to switching systems, and more particularly to switching electronic circuits with reduced EMI.

Switching systems or switched mode systems are electronic circuits that employ transistors to regulate an electrical current or voltage by switching transistors on and off. A supply current or voltage is rapidly connected and disconnected from an output by the transistors, providing a reduced and controlled level of current or voltage at the output. For example, a number of well known designs exist for switched mode power converters and amplifiers, such as a bridge-tied load (10, FIG. 1) in a class D audio amplifier. However, switched mode systems are susceptible to causing electromagnetic interference (EMI) that can have undesirable effects on nearby electronic circuits.

Referring to FIG. 1, a typical bridge-tied load or H-bridge 10 includes a load 12 connected in an H configuration between a left high-side driver or switch 14 and low-side switch 16 and a right high-side switch 18 and low-side switch 20. In operation, current flows through the load 12 from left to right 22 when the left high-side switch 14 and right low-side switch 20 are closed and the right high-side switch 18 and left low-side switch 16 are open. Current flows through the load 12 from right to left when the right high-side switch 18 and left low-side switch 16 are closed and the left high-side switch 14 and right low-side switch 20 are open. A number of switching schemes are used to control the switches 14-20, including a pulse width modulation (PWM) scheme of type BD, wherein switch 14 and switch 16 are in opposite states determined by a comparison of an input signal to a triangular carrier signal, and switch 18 and switch 20 are in other opposite states determined by a comparison of the inverted input signal to that same triangular carrier signal. BD modulation is sometimes called three-level modulation because there are portions of every clock cycle when both switched output nodes 24 and 26 are either at VDD or at ground, effectively applying zero voltage across the load. The carrier frequency is usually several hundred kilohertz or higher for an audio amplifier, and the rapidly rising switching wave forms produce significant EMI radiation in the 30-1000 MHz range. This EMI is suppressed using LC filters between the switched output nodes (e.g., 24 and 26) and the load 12, extensive decoupling on the VDD node 30, and even faraday cages, although these techniques require external components to be connected to integrated circuits containing the switching systems, increasing the size, complexity and cost of the system.

Thus, for at least the aforementioned reason, there exists a need in the art for switching electronic systems with reduced EMI.

BRIEF SUMMARY OF THE INVENTION

The present invention is related to switching systems, and more particularly to switching electronic circuits with reduced EMI.

Various apparatuses, methods and systems for switched mode electronic circuits with reduced EMI are disclosed herein. For example, some embodiments of the present invention provide apparatuses including a power supply, an output, and a composite switch connected between the power supply and the output. The composite switch includes a plurality of transistors connected in parallel, a switch closing delay line having a plurality of switch closing outputs each connected to a control input of one of the plurality of transistors, and a switch opening delay line having a plurality of switch opening outputs each connected to one of the plurality of switch closing outputs. The switch closing delay line and switch opening delay line are connected in an order that opens the plurality of transistors in a staggered order in time and closes the plurality of transistors in a reverse staggered order in time.

Other embodiments of the present invention provide a method of controlling a switched mode electronic circuit, including providing a first composite switch and a second composite switch and opening the first composite switch and closing the second composite switch. The composite switches each include a plurality of transistors connected in parallel, a switch closing delay line having a plurality of switch closing outputs each connected to a control input of one of the plurality of transistors, and a switch opening delay line having a plurality of switch opening outputs each connected to one of the plurality of switch closing outputs. The switch closing delay line and switch opening delay line are connected in an order that opens the plurality of transistors in a staggered order in time and closes the plurality of transistors in a reverse staggered order in time. The opening and closing are at least partially overlapping so that an increase of an impedance in the first composite switch is at least partially concurrent with a reduction of an impedance in the second composite switch, such that an inductive continuation of a current flowing through the first composite switch is substantially transferred to the second composite switch. The increase and reduction of impedance may be shaped as desired.

In other instances of the aforementioned method, the first and second outputs are biased to a voltage substantially halfway between a power supply and a ground during at least a portion of a period when the first composite switch is opening and the second composite switch is closing.

In yet other instances of the aforementioned method, the plurality of transistors in the first composite switch have a range of different sizes with the sizes in the range increasing substantially exponentially and the opening of the first composite switch comprises sequentially opening the plurality of transistors in the first composite switch in an order from a largest to a smallest transistor. The closing of the second composite switch comprises sequentially closing the plurality of transistors in the second composite switch in an order from a smallest to a largest transistor.

Other embodiments of the present invention provide an H-bridge amplifier, including a first composite switch connected between a power supply and a first output, a second composite switch connected between the first output and a ground, a third composite switch connected between the power supply and a second output, a fourth composite switch connected between the second output and the ground and a fifth composite switch (or pair of composite switches) connected between the first output and the second output. The composite switches each comprise a plurality of transistors connected in parallel, a switch closing delay line and a switch opening delay line. The plurality of transistors have a substantially exponential progression of different sizes. The delay lines each include a plurality of switch closing and switch opening outputs connected to control inputs of the transistors. The switch closing delay line and switch opening delay line are connected in an order that opens the plurality of transistors in a staggered order in time and closes the plurality of transistors in a reverse staggered order in time. The timing of the H-bridge amplifier is adapted so that when the first, second, third and fourth composite switches are opened, an inductive current between the first output and the second output is substantially carried through the fifth composite switch. The H-bridge amplifier also includes a first bias circuit connected to the first output and a second bias circuit connected to the second output. The bias circuits each include a resistor divider connected between the power supply and the ground and a transistor voltage divider connected between the power supply and the ground. The resistor divider has a higher impedance than the transistor voltage divider. The H-bridge amplifier is adapted to enable the transistor voltage divider only during a transition when at least some of the first, second, third and fourth composite switches are being opened and none of the first, second, third and fourth composite switches are being left closed and the fifth composite switch is being closed.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components.

DETAILED DESCRIPTION OF THE INVENTION

The drawings and description, in general, disclose various embodiments of switched mode electronic circuits with reduced EMI. Composite switches are disclosed in which opening and closing transitions can be controlled to substantially minimize flyback and shoot-through currents that cause current spikes on the power supply and lead to EMI. Rather than using break-before-make transitions between switches that induce flyback and shoot-through currents, overlapping transitions with shaped impedance versus time characteristics are employed. In H-bridge configurations of switching systems, the outputs are biased at a mid-supply level, particularly when opening output composite switches and closing a shunt switch. Again, this contains inductive currents during transitions and minimizes flyback and shoot-through currents that would otherwise cause EMI. Although particular embodiments of switching systems with H-bridge configurations are discussed herein using composite switches and other inventive techniques, it is important to note that the composite switches and other inventive techniques are not limited to use with an H-bridge configuration. The invention may be adapted to use with any switching system, such as power converters and amplifiers. For example, a buck converter may also be configured with composite switches and the switch transition timing and overlapping that will be discussed below to minimize EMI from the buck converter.

Figure 1:
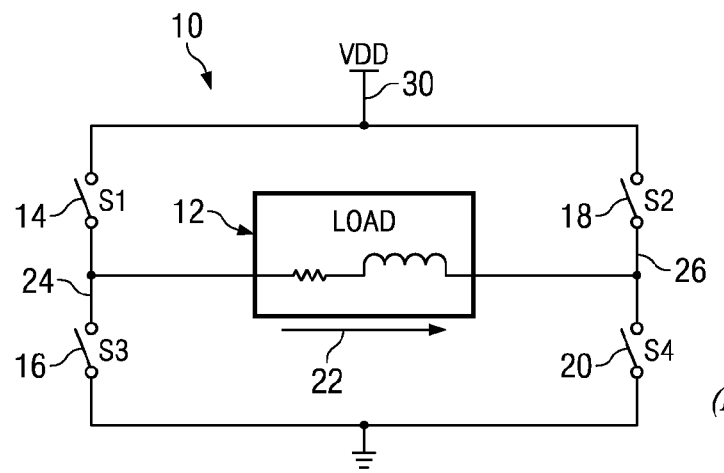
FIG. 1 depicts a prior art bridge tied load.
Figure 2:
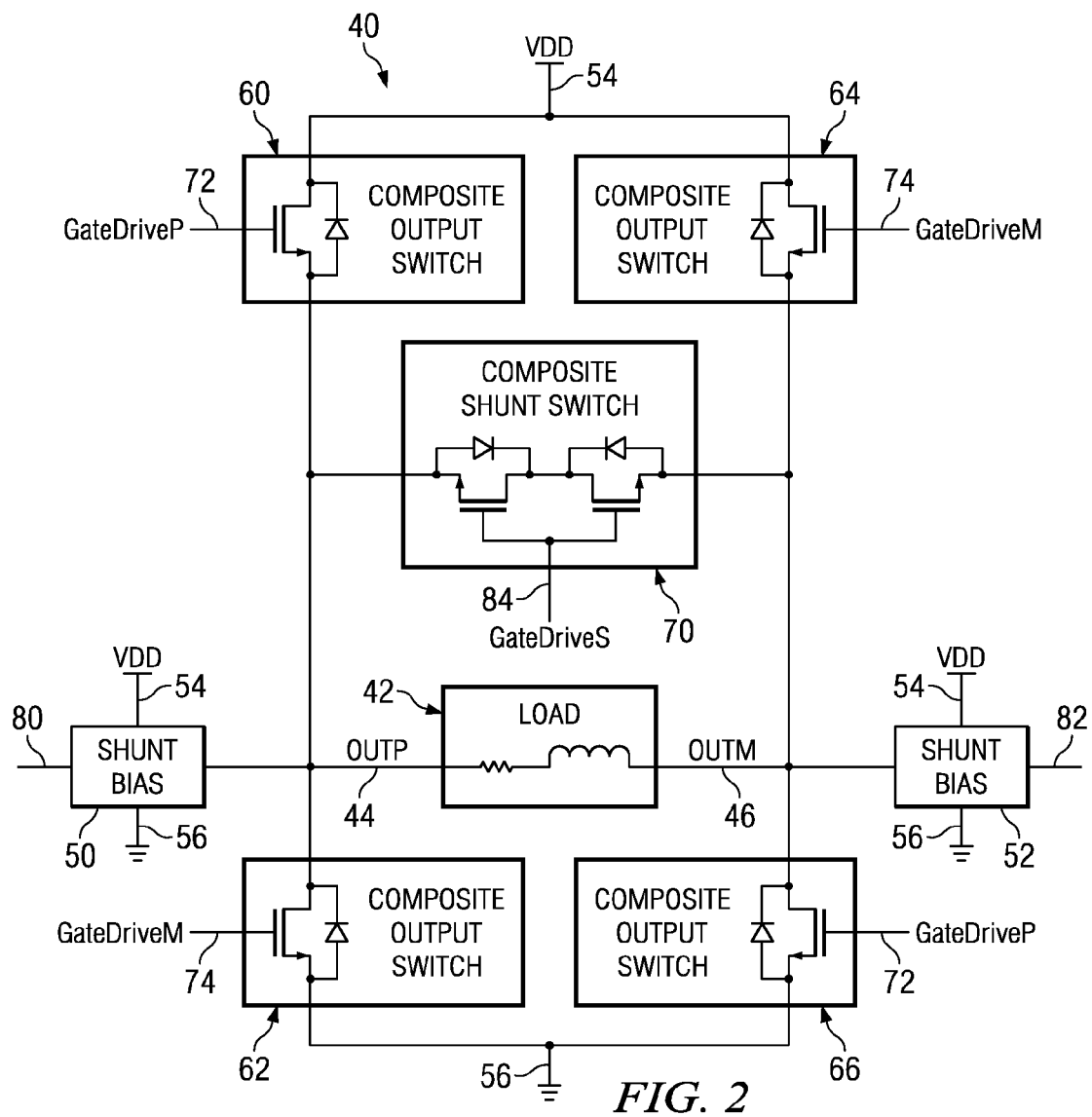
FIG. 2 depicts a bridge tied load with mid-supply biasing and composite switches for controlling switch transitions in accordance with some embodiments of the present invention.

Turning now to FIG. 2, an H-bridge amplifier 40 is illustrated for powering a bridge-tied load 42. The H-bridge amplifier 40 is not limited to use with any particular modulation scheme to control the gate drive signals in the H-bridge amplifier 40, and the modulation scheme will not be discussed in detail herein. However, in one particular embodiment, the H-bridge amplifier 40 employs a PWM BD modulation scheme.

The load 42 is connected between a first output OUTP 44 and a second output OUTM 46. Shunt biasing circuits 50 and 52 are used to bias the outputs 44 and 46 midway between the supply voltage 54 and ground 56, particularly during transitions in the H-bridge amplifier 40 when the outputs 44 and 46 are about to be left floating as will be described in more detail below. A left high-side composite switch 60 is connected between OUTP 44 and VDD 54. A left low-side composite switch 62 is connected between OUTP 44 and ground 56. A right high-side composite switch 64 is connected between OUTM 46 and VDD 54. A right low-side composite switch 66 is connected between OUTM 46 and ground 56. In operation, current is made to flow through the load 42 from OUTP 44 to OUTM 46 by closing the left high-side composite switch 60 and the right low-side composite switch 66 and opening the right high-side composite switch 64 and the left low-side composite switch 62. Current is made to flow through the load 42 from OUTM 46 to OUTP 44 by closing the right high-side composite switch 64 and the left low-side composite switch 62 and opening the left high-side composite switch 60 and the right low-side composite switch 66. When all four composite switches 60-66 are opened during various states of the modulation scheme, both the OUTP 44 and OUTM 46 are biased to the mid-supply voltage by the shunt biasing circuits 50 and 52 but would otherwise be left floating.

Because the load 42 has some inherent inductance, it resists changes in current. Thus, when switching from one state to another, the inductance of the load 42 briefly attempts to maintain the current previously flowing through the load 42. For example, given a PWM BD modulation scheme, one particular state has current flowing through the load 42 from OUTP 44 to OUTM 46 with the left high-side composite switch 60 and the right low-side composite switch 66 closed and the right high-side composite switch 64 and the left low-side composite switch 62 open. When transitioning to the next state, the left high-side composite switch 60 and the right low-side composite switch 66 are opened, but the inductance of the load 42 keeps the current flowing from OUTP 44 to OUTM 46. In a conventional H-bridge amplifier, this would remove charge from OUTP 44 and deposit it on OUTM 46, raising the voltage of OUTM 46 until it reached one diode drop above VDD 54. At that point, the parasitic diode in the right high-side composite switch 64 would clamp OUTM 46 at a voltage of one diode drop above VDD 54 and dump current into VDD 54 from OUTM 46. This flyback current from OUTM 46 to VDD 54 would cause a current spike on the power supply pins outside of the integrated circuit housing the H-bridge amplifier 40, leading to undesirable EMI.

The H-bridge amplifier 40 according to one particular embodiment of the invention prevents this flyback current by providing a composite shunt switch 70 connected in parallel with the load 42 between OUTP 44 and OUTM 46. When some of the composite output switches 60-66 are being opened and none of the composite output switches 60-66 are left closed, the composite shunt switch 70 is closed to recirculate and capture the inductive current through the load 42. For example, as the left high-side composite switch 60 and right low-side composite switch 66 are being opened, the composite shunt switch 70 is closed so that the inductive continuation of the current through the load 42 circulates from OUTP 44 through the load 42 to OUTM 46 and back through the composite shunt switch 70 to OUTP 44. This prevents the voltage of OUTP 44 and OUTM 46 from substantially changing due to the inductance of the load 42 during the transition from one state of operation to another.

As described above with respect to the modulation scheme, the gate drive signals for the composite output switches 60-66 may be operated as in any other switching system or as otherwise desired. For example, the left high-side composite switch 60 and right low-side composite switch 66 in an H-bridge amplifier 40 may be driven by a common GateDriveP signal 72, and the right high-side composite switch 64 and left low-side composite switch 62 may be driven by a common GateDriveN signal 74, although various level shifting and buffering of the gate drive signals 72 and 74 may employed at different points as desired. Control inputs 80 and 82 to the shunt bias circuits 50 and 52 may be driven by intermediate gate drive signals taken from the composite output switches 60-66 as will be discussed in more detail below. The gate drive signal GateDriveS 84 for the composite shunt switch 70 may be provided using combinational logic based on the GateDriveP 72 and GateDriveN 74 signals so that the composite shunt switch 70 is closed whenever the composite output switches 60-66 are all open, and preventing the GateDriveP 72 and GateDriveN 74 signals from being simultaneously asserted and shorting VDD 54 to ground 56. For example, GateDriveS 84 may be formed by combining preliminary versions of GateDriveP 72 and GateDriveN 74 in an XNOR gate. The final version of GateDriveP 72 may be formed by combining the initial version of GateDriveP 72 and the output of the XNOR gate in a NOR gate. The final version of GateDriveN 74 may similarly be formed by combining the initial version of GateDriveN 74 and the output of the XNOR gate in a NOR gate.

Figure 3:
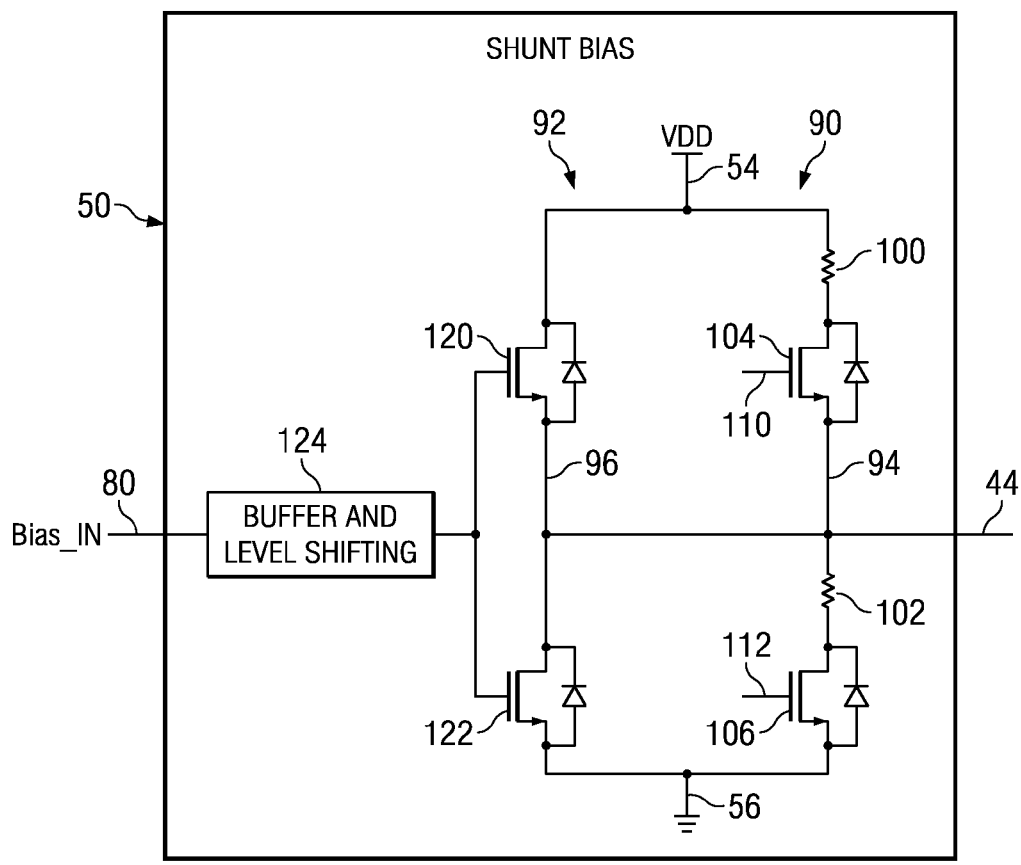
FIG. 3 depicts a mid-supply bias circuit for biasing a shunt switch for the bridge tied load of FIG. 2.

Turning now to FIG. 3, the shunt biasing circuits (e.g., 50) will be described. Two voltage divider networks 90 and 92 are connected between VDD 54 and ground 56, with midpoints or outputs 94 and 96 connected to the output (e.g., 44) of the H-bridge amplifier 40. The first voltage divider network 90 includes an upper resistor 100 connected between VDD 54 and the output 94, and a lower resistor 102 connected between the output 94 and ground 56. The resistance of the two resistors 100 and 102 are substantially equal, so that the output 94 is biased to a mid-supply voltage of VDD/2. The first resistor divider network 90 is active whenever the H-bridge amplifier 40 is powered, although a pair of transistors 104 and 106 may be connected in series with the two resistors 100 and 102 to disable the first resistor divider network 90 if the H-bridge amplifier 40 is turned off, by asserting the gates 110 and 112 of the pair of transistors 104 and 106. The second voltage divider network 92 includes an upper transistor 120 connected between VDD 54 and the output 96, and a lower transistor 122 connected between the output 96 and ground 56. The impedance of the first voltage divider network 90 is greater than the second voltage divider network 92, so the first voltage divider network 90 may be left active during all operational states of the H-bridge amplifier 40 to apply a mid-supply bias to the OUTP 44 and OUTM 46 nodes. However, during the transition when some of the composite output switches 60-66 are being opened, none of the composite output switches 60-66 are left closed and the composite shunt switch 70 is closed, OUTP 44 and OUTM 46 are left floating with a recirculating inductive current and the first voltage divider network 90 may not be strong enough to pull OUTP 44 and OUTM 46 to VDD/2. During this transition, the second voltage divider network 92 is enabled by the control input 80 to the shunt biasing circuit 50 to more strongly pull OUTP 44 to VDD/2. In one particular embodiment, the resistors 100 and 102 in the first voltage divider network 90 of the shunt biasing circuit 50 each have a resistance of 2 kΩ, whereas the biasing transistors 120 and 122 of the second voltage divider network 92 each have a resistance of about 50Ω. The required impedances will vary depending upon VDD and the load impedance. (Note that the control input 80 may be buffered and level-shifted 124 as needed.)

Figure 4:
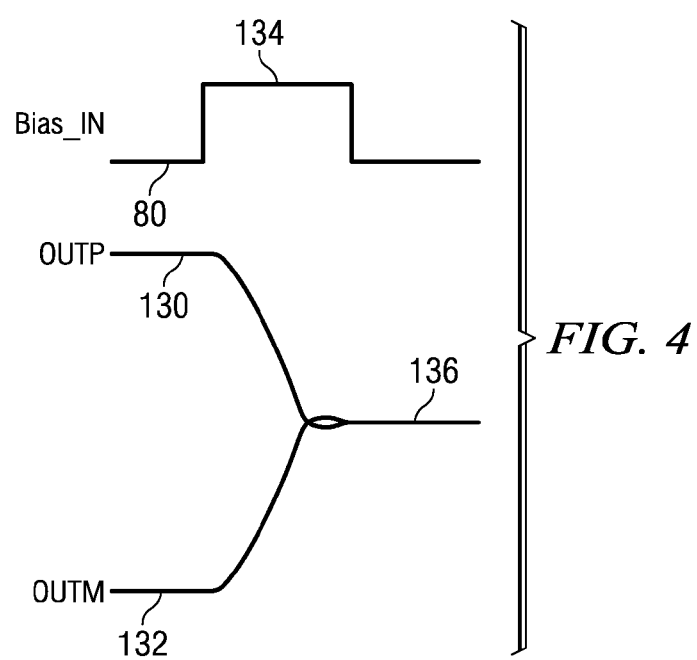
FIG. 4 depicts a timing diagram for the mid-supply bias circuit of FIG. 3.

Turning now to FIG. 4, the timing of a pulse on the control input 80 used to activate the second voltage divider network 92 will be described. The voltage 130 of the OUTP 44 node is plotted against the voltage 132 of the OUTM 46 node during a transition from a first state (an output driving state, or driven state) to a second state (a shunted floating output state, or shunt state). In the driven state, the left high-side composite switch 60 and right low-side composite switch 66 are closed and the right high-side composite switch 64 and left low-side composite switch 62 are open. In the shunt state, all four composite output switches 60-66 are open and the composite shunt switch 70 is closed. During the transition between the driven and shunt states of operation of this example, a pulse 134 is applied to the control input 80 of the shunt biasing circuit 50 (and to the other shunt biasing circuit 52) to cause the OUTP 44 and OUTM 46 to settle at a mid-supply voltage level 136. As will be described in more detail below, the signals used to turn on and off the pulse 134 on the control input 80 of the shunt biasing circuit 50 may be taken from intermediate gate drive signals used to close the composite shunt switch 70.

Figure 5:
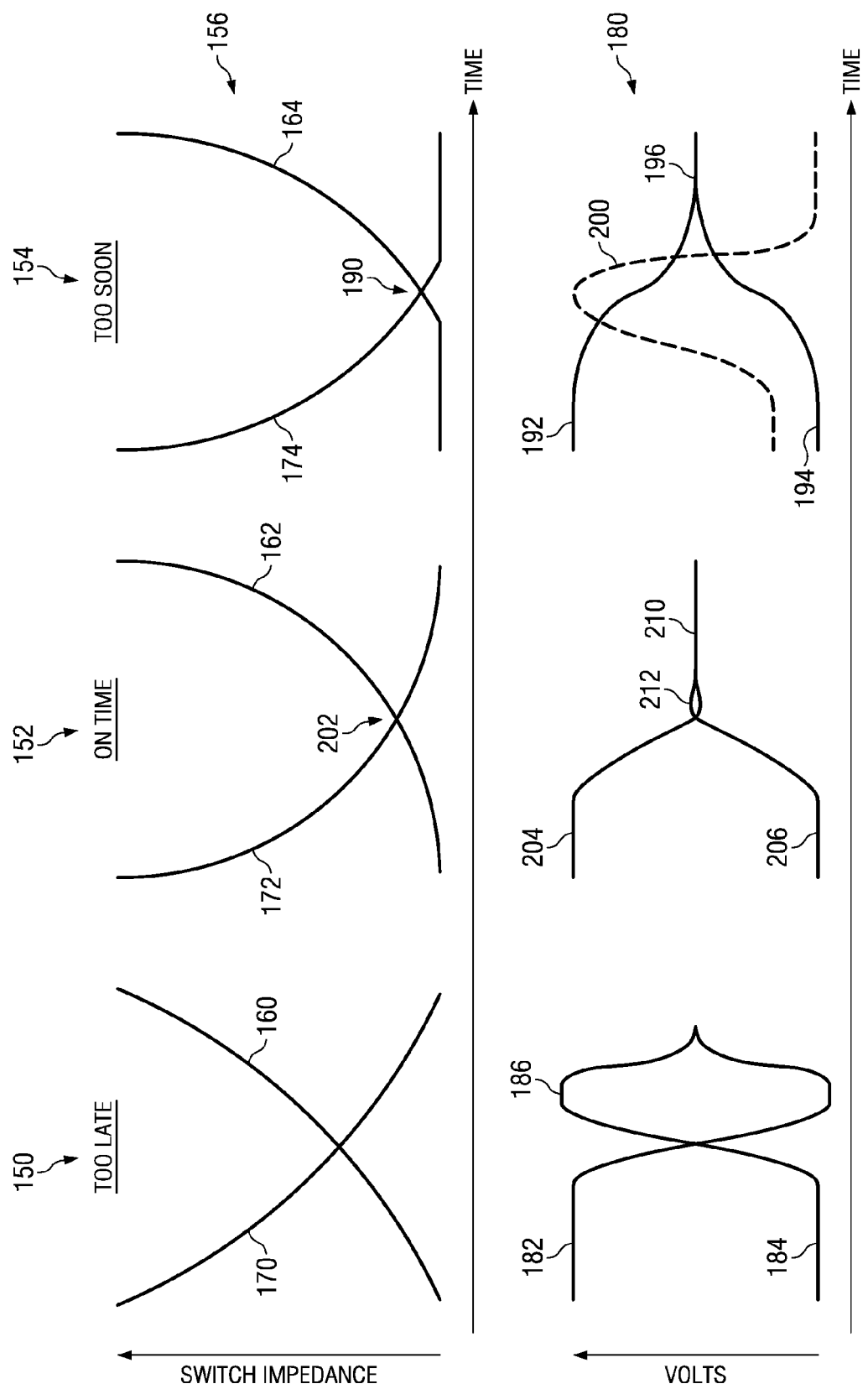
FIG. 5 depicts timing, voltage and current diagrams for switch transitions for the bridge tied load of FIG. 2.

Turning now to FIG. 5, the timing of transitions from the driven state and the shunt state will be discussed in more detail. Unlike typical Class-D output stages that include a dead-time to prevent against shoot-through currents, the output stage using composite switches according to one particular embodiment of the invention uses a negative dead-time or overlap when switching from the driven state to the shunt state, and vice versa. This helps prevent the outputs OUTP 44 and OUTM 46 from flying to the supply rails VDD 54 and ground 56 due to the current in the inductive load 42, thereby shooting past the VDD/2 level instead of settling there. In the shunt-to-driven transition, smooth transitions on the outputs OUTP 44 and OUTM 46 may be achieved using the composite switches, overlapping transitions and biasing disclosed herein, preventing current spikes to the supply rails VDD 54 and ground 56 and avoiding turning on the parasitic diodes associated with the composite output switches 60-66.

The desired overlapping of composite switch transitions is illustrated in the three cases 150, 152 and 154 of FIG. 5, each of which illustrates a different overlap during the driven-to-shunt transition. The top row of curves 156 represents switch impedance versus time during the transition, with the rising impedance curves 160, 162 and 164 corresponding to composite output switches 60-66 and the falling impedance curves 170, 172 and 174 corresponding to the composite shunt switch 70. The bottom row of curves 180 shows the corresponding transition of the output voltages versus time. In the first case 150, the composite shunt switch 70 is turned on too late. As the left high-side and right low-side composite switches 60 and 66 are turned off or opened, the impedance 160 of the combined closing left high-side and right low-side composite switches 60 and 66 increases, the OUTP voltage 182 begins to drop and the OUTM voltage 184 begins to rise.

The resulting drop in the current through the left high-side and right low-side composite switches 60 and 66 and the load 42 is resisted by the inductance of the load 42, which continues to drive current through the load 42 from OUTP 44 to OUTM 46, taking electrical charge from OUTP 44 and depositing it on OUTM 46. As the composite shunt switch 70 begins to close, the impedance 170 of the composite shunt switch 70 begins to fall. However, if the composite shunt switch 70 does not close early enough to recirculate substantially all of the inductive current through the load 42, the flyback current through the load 42 can cause the voltage on OUTM 46 will rise to a voltage level 186 of one diode drop above VDD 54 when the parasitic diode of the right high-side composite switch 64 turns on and dumps charge into VDD 54 from OUTM 46. This dumping of current into the supply rails causes undesirable EMI.

If the composite shunt switch 70 closes too soon during the transition as illustrated in the right column 154 of FIG. 5, the combined impedance 190 of the left high-side and right low-side composite switches 60 and 66 (impedance 164) and the composite shunt switch 70 (impedance 174) is very low, creating a near short circuit between VDD 54 and ground 56. Although the voltages 192 and 194 of OUTP 44 and OUTM 46 center at a mid-supply level 196 with the help of the shunt biasing circuits 50 and 52, the near short circuit between VDD 54 and ground 56 leads to a spike in the power supply current 200, again causing undesirable EMI.

The desired transition timing between the driven state and the shunt state is illustrated in the center column 152 of FIG. 5. The opening of the left high-side and right low-side composite switches 60 and 66 and the closing of the composite shunt switch 70 are overlapped so that the increasing impedance 162 of the left high-side and right low-side composite switches 60 and 66 intersects with the decreasing impedance 172 of the composite shunt switch 70 at the desired impedance level 202. This desired impedance level 202 is substantially the same as the impedance of the load 42, and causes substantially all of the inductive current through the load 42 to be recirculated through the composite shunt switch 70. In one particular embodiment of a H-bridge amplifier 40 used to amplify an audio signal to an 8Ω load, the combined impedance of the left high-side and right low-side composite switches 60 and 66 and the composite shunt switch 70 at the intersection point 202 is about 12Ω, roughly the same order of magnitude as the load impedance. Thus, as the voltage 204 of OUTP 44 drops and the voltage 206 of OUTM 46 rises, the composite shunt switch 70 catches and recirculates the inductive current through the load 42 so that OUTP 44 and OUTM 46 settle at a mid-supply voltage level 210. Although a minor amount of voltage overshoot 212 may occur, flyback and shoot-through current is minimized, greatly reducing EMI from the H-bridge amplifier 40.

Figure 6:
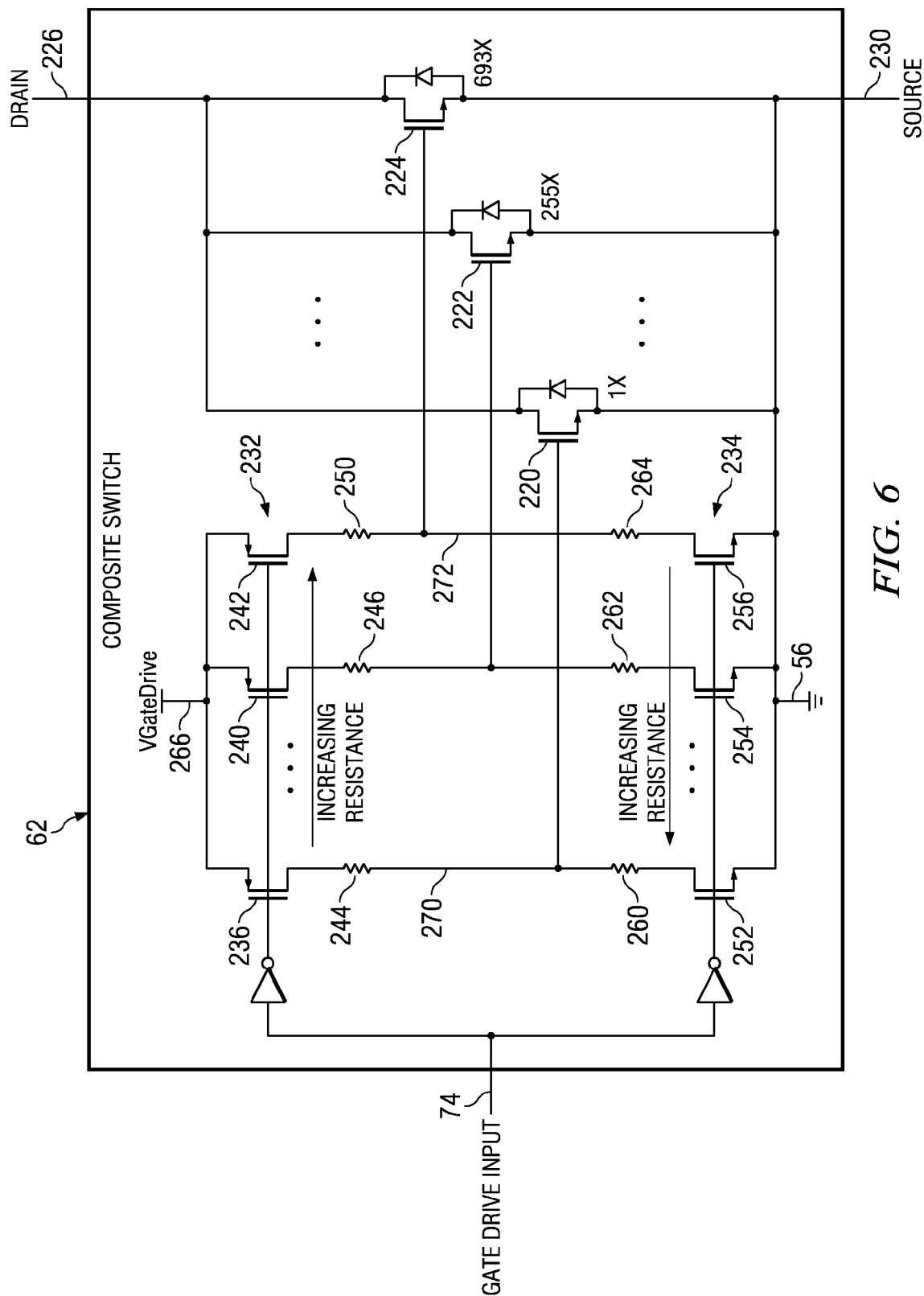
FIG. 6 depicts a composite switch in accordance with some embodiments of the present invention.

It is far easier to control the overlap of a slow transition than it is a fast one. Slow transitions have the additional benefit of reduced high frequency energy and lead to lower EMI. An exponential resistance versus time profile provides a measure of insensitivity to manufacturing variances. The transitions between a driven state and a shunt state are therefore slowed by the use of composite switches with a substantially or approximate exponential transistor resistance versus time characteristic shape. In one particular embodiment, the switching of a composite switch are slowed to about 100 nsec. Turning now to FIG. 6, the composite switches (e.g., 62) and the shaped resistance versus time profile will be described in detail. The switches used in the switched mode electronic system (e.g., 62) are divided into multiple independently controlled switches in parallel, each with an exponentially decreasing resistance. In one particular embodiment, the output switches are divided into eight NMOS transistors 220, 222, 224 that are connected in parallel, with common drains 226 and common sources 230. An exponential resistance versus time results when the switches are controlled by a signal passed through a tapped delay line. A switch closing delay line 232 and a switch opening delay line 234 are used to turn on and off the composite switch 62, respectively, when triggered by a gate drive signal 74. The delay lines 232 and 234 each include eight segments to turn on and off the eight output transistors (e.g. 220, 222 and 224) in a staggered fashion in time. In one particular embodiment, the delay lines 232 and 234 insert a delay of about 2 ns between the turning on or off of each successive output transistor (e.g. 220, 222 and 224).

The switch closing delay line 232 includes a group of PMOS transistors (e.g., 236, 240, 242) connected in parallel, each being connected at the drain to a resistor (e.g., 244, 246 and 250) having a different resistance value, with the resistors (e.g., 244, 246 and 250) all connected at an opposite end to the gate of one of the output transistors (e.g., 220, 222, 224). Similarly, the switch opening delay line 234 includes a group of NMOS transistors (e.g., 252, 254, 256) connected in parallel, each being connected at the drain to a resistor (e.g., 260, 262 and 264) having a different resistance value, with the resistors (e.g., 260, 262 and 264) all connected at an opposite end to the gate of one of the output transistors (e.g., 220, 222, 224). The sources of the PMOS transistors (e.g., 236, 240, 242) are connected to a gate drive voltage VGateDrive 266, and the sources of the NMOS transistors (e.g., 252, 254, 256) are connected to ground 56. The gates of the PMOS transistors (e.g., 236, 240, 242) and the NMOS transistors (e.g., 252, 254, 256) are all driven by the gate drive input (e.g., 74). The resistance values of the resistors (e.g., 244, 246 and 250) in the switch closing delay line 232 increase the further along the delay line from the gate drive input 74, whereas the resistance values of the resistors (e.g., 260, 262 and 264) in the switch opening delay line 234 decrease the further along the delay line from the gate drive input 74. The smallest of the output transistors (e.g., 220) is connected to the earliest output 270, and the largest of the output transistors (e.g., 224) is connected to the latest output 272. In one particular embodiment, the resistors (e.g., 244, 246, 250, 260, 262 and 264) have a linear increase in resistance value along the delay lines 232 and 234, although the resistance values may be varied in other ways as desired. The switch closing delay line 232 pulls the gates of the output transistors (e.g., 220, 222 and 224) up to VGateDrive 266 in a controlled fashion, staggered in time, based on the time constants of the pull-up resistors (e.g., 244, 246 and 250) and the capacitance of the output nodes (e.g., 270 and 272), thereby turning on the composite switch (e.g., 62) relatively slowly with a controlled impedance profile. When the gate drive input 74 is in an opposite state, the switch opening delay line 234 pulls the gates of the output transistors (e.g., 220, 222 and 224) down to ground 56 in a controlled fashion, staggered in time, based on the time constants of the pull-down resistors (e.g., 260, 262 and 264) and the capacitance of the output nodes (e.g., 270 and 272), thereby turning off the composite switch (e.g., 62) relatively slowly with a controlled impedance profile. As a result of the delay lines 232 and 234, the output transistors 220-224 are turned on from smallest 220 to largest 224, and turned off in the reverse order from largest 224 to smallest 220. Thus, the switching on and off of the composite switches 60-66 is intentionally slowed so that their impedance during transitions is the same as the impedance of the composite shunt switch 70, and at a level that will not cause shoot-through or allow the output nodes OUTP 44 and OUTM 46 to rail. Furthermore, in one particular embodiment, the resistances in the switch closing delay line 232 are matched with the resistances in the switch opening delay line 234, so the turn-on time matches the turn-off time for the composite switches. Because of the substantially exponential increase in the sizes of the output transistors (e.g., 220, 222 and 224), the overall impedance of the composite switch (e.g., 62) has a substantially exponential increase and decrease during transitions, as illustrated in the curves 162 and 172 of FIG. 5. In one particular embodiment, the eight output transistors (e.g., 220, 222 and 224) have a relative size progression of about 1×, 2×, 5×, 13×, 35×, 94×, 255×, and 693× to form a substantially exponential increase and decrease of impedance during transitions.

The composite output switches and transition timing described herein provide a shaped increase and decrease of impedance using a shaped increase in the size of output transistors (e.g., 220, 222 and 224) in each composite switch. In other particular embodiments, the shaped increase and decrease of impedance may be provided by a shaped variation in the time delay of the delay lines 232 and 234. It is important to note that the invention is not limited to any particular shape for the increase and decrease of impedance such as the substantially exponential shape of various particular embodiments described herein, and that the increase and decrease of impedance may be given any monotonically increasing or decreasing shape, such as exponential, quadratic, linear, etc.

In one particular embodiment, each of the composite output switches 60-66 of the H-bridge amplifier 40 comprise a circuit as illustrated in FIG. 6. In the left high-side composite switch 60 and right high-side composite switch 64 of the H-bridge amplifier 40, the common drains (e.g., 226) of the composite switches are connected to VDD 54 and the common sources (e.g., 230) are connected to their respective output nodes OUTP 44 and OUTM 46. In the left low-side composite switch 62 and right low-side composite switch 66, the common sources (e.g., 230) are connected to ground 56 and the common drains (e.g., 226) are connected to their respective output nodes OUTP 44 and OUTM 46. The composite shunt switch 70 comprises a pair of composite switches as illustrated in FIG. 6, with the pair having the common drains (e.g., 226) connected together and the common sources (e.g., 230) each connected to one of the output nodes OUTP 44 and OUTM 46. Including a pair of composite switches in the composite shunt switch 70, with the parasitic diodes oriented in opposite directions, prevents having a diode short circuit in either direction. The VGateDrive 266 used in each composite switch (e.g., 62) may have any desired voltage level, such as one diode drop below VDD 54. By applying the same voltage level for the VGateDrive 266 rail in each of the composite switches 60-66 and 70 in the H-bridge amplifier 40, every composite switch has the same gate to source voltage and therefore, the same on resistance. Thus, the total impedance of two composite output switches (e.g., 60 and 66) can be matched with the total impedance of the two back to back composite switches in the composite shunt switch 70.

Figure 7:
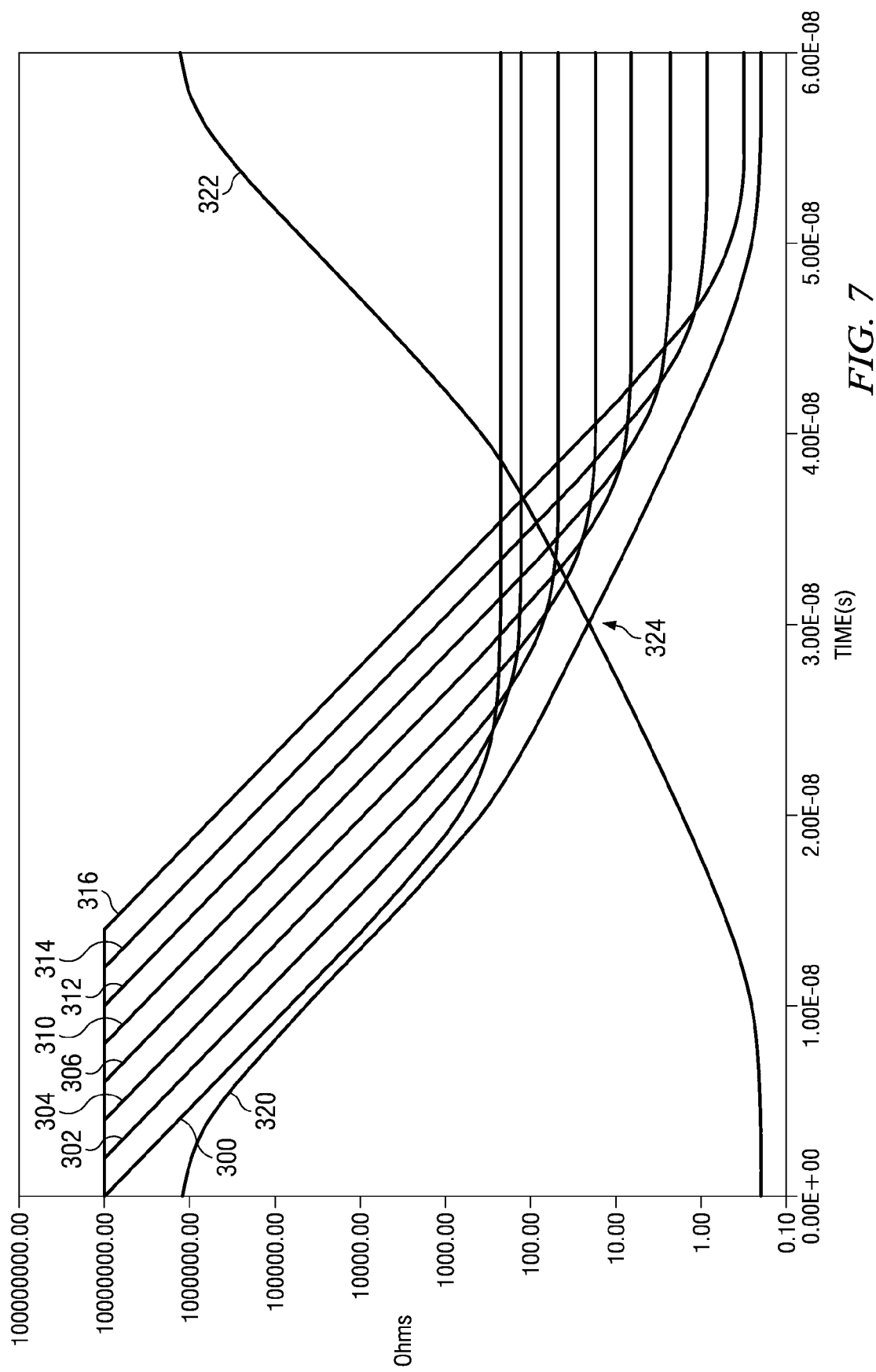
FIG. 7 depicts a logarithmic plot of impedance values for composite switches during a transition period.

Turning now to FIG. 7, the drain to source impedances (300, 302, 304, 306, 310, 312, 314 and 316) of the eight parallel transistors in one composite switch as they close are plotted as a function of time on a logarithmic scale. The overall impedance 320 of the composite switch as it closes is also plotted, along with the overall impedance 322 of another composite switch as it opens. (The component impedances of the individual transistors in the second composite switch are omitted from FIG. 7 for clarity.) Note that the plotted impedances 320-322 correspond with composite switches in two different types of state transitions, from driven-to-shunt and from shunt-to-driven. For example, for the driven-to-shunt transition the closing switch (e.g., 300-320) may correspond with the sum of the impedance of the left high-side composite switch 60 and the right low-side composite switch 66, while the opening switch (e.g., 322) would correspond with the sum of the impedance of the two composite switches in the composite shunt switch 70. On the other hand, for the shunt-to-driven transition the closing switch (e.g., 300-320) may correspond with the sum of the impedance of the two composite switches in the composite shunt switch 70, while the opening switch (e.g., 322) would correspond with the sum of the impedance of the left high-side composite switch 60 and the right low-side composite switch 66. Note that the drop in impedance (300-316) of each of the eight parallel transistors in a composite switch is staggered in time, that is, the switch closing delay line (e.g., 232) turns on each successive parallel transistor with an increasing delay. The steady state on impedance of each of the eight transistors is also at a different level, because of the substantially exponential nature of the increasing size among the eight transistors. (The difference in steady state on impedance of the eight transistors appears to be a linear or constant change because of the logarithmic scale of FIG. 7.) The combined change in impedance 320 of the composite switch based on the impedances (300, 302, 304, 306, 310, 312, 314 and 316) of the eight parallel transistors approximates or substantially provides the exponential profile sought in curve 172 of FIG. 5, providing an ideal overlapping of composite switches during a state transition to minimize flyback and shoot-through current, and therefore minimizing EMI.

The overall time to turn on or off a composite switch may also be adapted as desired by varying the delays in the switch closing delay line 232 and switch opening delay line 234 of each composite switch. Very rapid switching increases EMI while slower switching reduces EMI and keeps the overall output impedance low. If the switching is more rapid, causing steeper impedance changes (e.g., to 320 and 322 of FIG. 7), small changes in the switch timing may greatly change the impedance of the crossover point 324. By switching more slowly, the crossover or intersection point 324 can be controlled, resulting is more control of overall impedance in the H-bridge amplifier 40. For example, given a design goal that the output impedance of the H-bridge amplifier 40 be roughly equal to or less than the impedance of the load 42, the switch timing is made slow enough that the impedance of the intersection point can be kept roughly equal to or less than the load impedance, even with process variations during manufacturing, etc. The profile of the impedance curves 320 and 322 and the location of the crossover point 324 can thus be controlled to match the desired curves 162 and 172 of FIG. 5. Having a crossover point 324 at too high an impedance leads to flyback current as in the first case 150 of FIG. 5, and a crossover point 324 at too low an impedance leads to shoot-through current by shorting VDD 54 to ground 56.

Turning back to FIGS. 3 and 4, the source of the control input 80 for the shunt biasing circuits 50 and 52 is taken from a combination of the GateDriveS signal 84 (FIG. 2) used to turn on the composite shunt switch 70 and one of the intermediate gate drive signals used to turn on the parallel transistors inside the composite shunt switch 70. In one particular embodiment, the GateDriveS 84 is combined in a NOR gate with the intermediate gate drive signal for the largest and most-delayed parallel transistor in the composite shunt switch 70 (see, e.g., output 272 of FIG. 6). The output of the NOR gate may be buffered and level shifted as desired and used as the control input 80 to the shunt biasing circuits 50 and 52.

Note that the parallel transistors in a composite switch are sized such that the combined size of all the parallel transistors gives the desired on resistance for the composite switch. For example, to drive an 8Ω load such as a speaker, a lower impedance output switch with an on resistance of about 100 mΩ may be desired. This total desired impedance is divided by the number of parallel transistors included in the composite switch, and the parallel transistors are then sized with a substantially exponential curve. A larger number of transistors in each composite switch will better approximate a true exponential curve and will best minimize flyback and shoot-through currents, thereby minimizing EMI due to current spikes on the power supply pins of the integrated circuit. A smaller number of transistors may be used to minimize complexity, with some reduction in the ability to minimize EMI.

Figure 8:
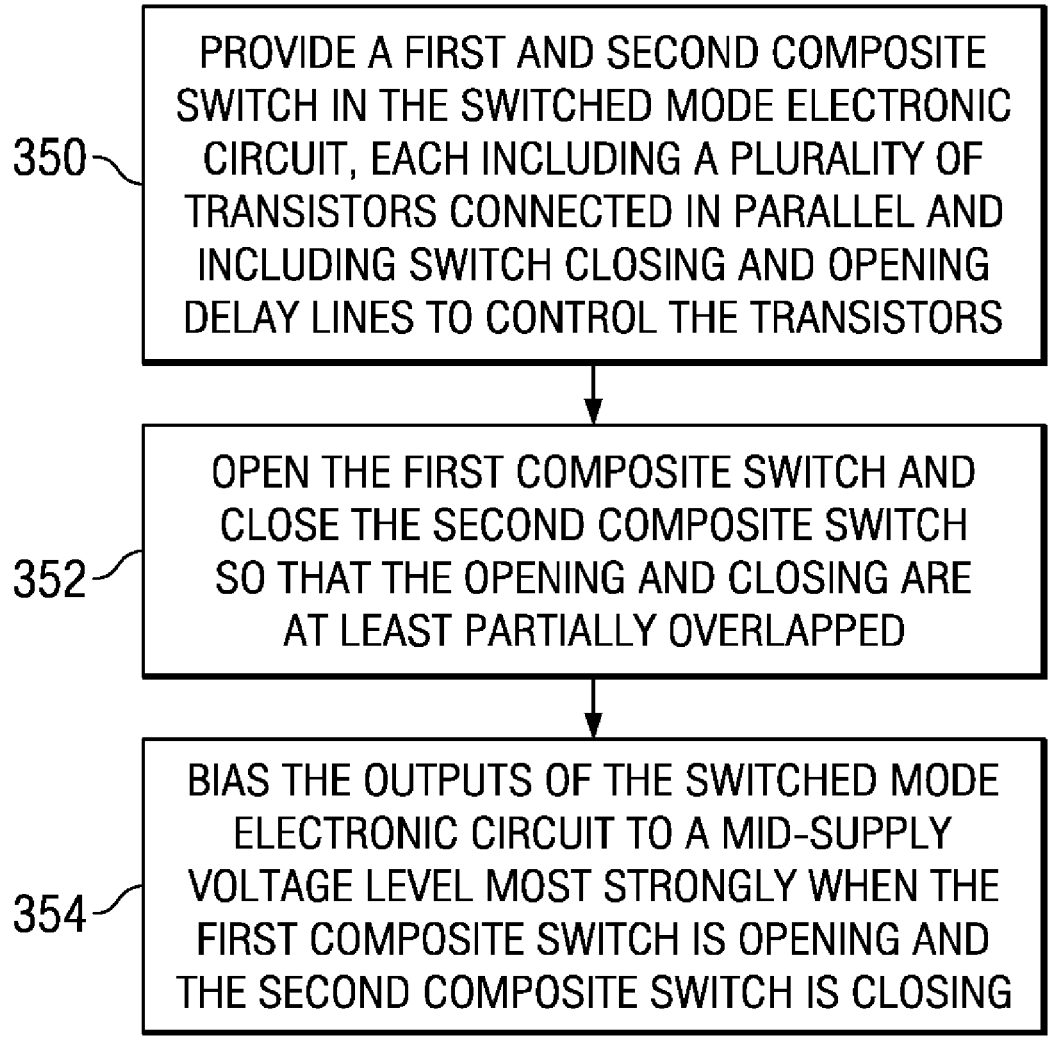
FIG. 8 is a flow chart of a method for switching in an electronic circuit.

Turning now to FIG. 8, a method of controlling a switched mode electronic circuit is summarized. The method describes the use of composite switches in any type of switch-mode electronic circuit, such as the H-bridge amplifier 40 described above according to one particular embodiment of the invention, or in any other switched mode electronic circuit such as a buck converter. A first and second composite switch are provided, each including a plurality of transistors connected in parallel and including switch closing and opening delay lines to control the transistors. (Block 350) The switch closing delay line and switch opening delay line are connected in an order that opens the plurality of transistors in a staggered order in time and closes the plurality of transistors in a reverse staggered order in time. The method also includes opening the first composite switch and closing the second composite switch so that the opening and closing are at least partially overlapped. (Block 352) The overlapping is controlled so that a substantially exponential increase of an impedance in the first composite switch is at least partially concurrent with a substantially exponential reduction of an impedance in the second composite switch. An inductive continuation of a current flowing through the first composite switch is substantially transferred to the second composite switch. In one particular embodiment, the method may also include biasing the outputs of the switched mode electronic circuit to a mid-supply voltage level most strongly when the first composite switch is opening and the second composite switch is closing. (Block 354)

In conclusion, the present invention provides novel systems, devices, methods and arrangements for reducing EMI in a switching system. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus comprising:
   a power supply;
   a first output;
   a second output;
   a composite shunt switch coupled between the first and second outputs; and
   a composite switch coupled between the power supply and the first output, the composite switch including:
   a plurality of transistors coupled in parallel;
   a switch closing delay line having a plurality of switch closing outputs, wherein each switch closing output is coupled to a control input of one of the plurality of transistors; and
   a switch opening delay line having a plurality of switch opening outputs, wherein each switch opening output is coupled to one of the plurality of switch closing outputs, and wherein the switch closing delay line and switch opening delay line are coupled in an order that opens the plurality of transistors in a staggered order in time and closes the plurality of transistors in a reverse staggered order in time.

2. The apparatus of claim 1, wherein the plurality of transistors have a substantially shaped progression of different sizes with a shape selected from a group consisting of exponential, linear, and quadratic.

3. The apparatus of claim 1, wherein the apparatus is adapted to at least partially overlap an opening of the composite switch and a closing of the composite shunt switch so that a substantially exponential increase of an impedance in the composite switch is at least partially concurrent with a substantially exponential reduction of an impedance in the composite shunt switch, such that an inductive continuation of a current flowing through the composite switch is substantially transferred to the composite shunt switch.

4. The apparatus of claim 1, further comprising:
   a second composite switch coupled between the power supply and the second output;
   a third composite switch coupled between the first output and a ground;
   a fourth composite switch coupled between the second output and the ground, wherein the first, second, third and fourth composite switches comprise an H-bridge amplifier, the H-bridge amplifier being adapted to close the composite shunt switch when the first, second, third and fourth composite switches are open.

5. The apparatus of claim 1, wherein the switch closing delay line further comprises a plurality of resistors having a range of different sizes each switchingly coupled to a different one of the control inputs of the plurality of transistors, and wherein the switch closing delay line having an input coupled to a gate drive signal for the composite switch.

6. The apparatus of claim 5, wherein the switch opening line further comprises a plurality of resistors having a range of different sizes each switchingly coupled to a different one of the control inputs of the plurality of transistors, and wherein the switch opening delay line having an input coupled to a gate drive signal for the composite switch, and wherein the range of resistor sizes in the switch closing delay line is arranged from smallest to largest resistance beginning from the input, and wherein the range of resistor sizes in the switch opening delay line is arranged from largest to smallest resistance beginning from the input.

7. The apparatus of claim 6, wherein the plurality of resistors in the switch closing delay line are each switching coupled to the plurality of parallel transistors by a PMOS transistor, and the plurality of resistors in the switch opening delay line are each switching coupled to the plurality of parallel transistors by an NMOS transistor.

8. The apparatus of claim 4, further comprising a first biasing circuit coupled to the first output and a second biasing circuit coupled to the second output.

9. The apparatus of claim 8, wherein the first biasing circuit and second biasing circuit are adapted to bias the first output and the second output to a voltage level substantially midway between the power supply and the ground.

10. The apparatus of claim 9, wherein an impedance of each of the first biasing circuit and the second biasing circuit is reduced during at least a portion of a period when at least some of the first, second, third and fourth composite switches are being opened and none of the first, second, third and fourth composite switches are being left closed and the composite shunt switch is being closed.

11. The apparatus of claim 9, wherein the first biasing circuit comprises a resistor divider coupled between the power supply and the ground and having a biasing output coupled to the first output, and the second biasing circuit comprises a resistor divider coupled between the power supply and the ground and having a biasing output coupled to the second output.

12. The apparatus of claim 11, wherein the first biasing circuit further comprises a transistor voltage divider switchingly coupled between the power supply and the ground and having a second biasing output coupled to the first output, and the second biasing circuit comprises a transistor voltage divider switchingly coupled between the power supply and the ground and having a second biasing output coupled to the second output.

13. The apparatus of claim 4, wherein the apparatus is adapted to operate the first, second, third and fourth composite switches and the shunt switch to substantially minimize flyback and shoot-through currents through the first, second, third and fourth composite switches.

14. An H-bridge amplifier comprising:
a first composite switch coupled between a power supply and a first output;
a second composite switch coupled between the first output and a ground;
a third composite switch coupled between the power supply and a second output;
a fourth composite switch coupled between the second output and the ground;
a fifth composite switch coupled between the first output and the second output;
wherein the composite switches each comprise a plurality of transistors coupled in parallel, a switch closing delay line having a plurality of switch closing outputs each coupled to a control input of one of the plurality of transistors, and a switch opening delay line having a plurality of switch opening outputs each coupled to one of the plurality of switch closing outputs, wherein the plurality of transistors have a substantially exponential progression of different sizes, and wherein the switch closing delay line and switch opening delay line are coupled in an order that opens the plurality of transistors in a staggered order in time and closes the plurality of transistors in a reverse staggered order in time, and wherein a timing of the H-bridge amplifier is adapted so that when the first, second, third and fourth composite switches are opened, an inductive current between the first output and the second output is substantially carried through the fifth composite switch;
a first bias circuit coupled to the first output; and
a second bias circuit coupled to the second output, wherein the bias circuits each comprise a resistor divider coupled between the power supply and the ground and a transistor voltage divider coupled between the power supply and the ground, wherein the resistor divider has a higher impedance than the transistor voltage divider, and wherein the H-bridge amplifier is adapted to enable the transistor voltage divider only during a transition when at least some of the first, second, third and fourth composite switches are being opened and none of the first, second, third and fourth composite switches are being left closed and the fifth composite switch is being closed.

15. An apparatus comprising an H-bridge having a first output, a second output, and a plurality of composite output switches, wherein each composite output switch is coupled to at least one of the first and second outputs, wherein each composite output switch includes:
a first PMOS transistor that receives a drive signal at its gate;
a second PMOS transistor that receives the drive signal at its gate;
a first resistor that is coupled to the first PMOS transistor at its drain;
a second resistor that is coupled to the second PMOS transistor at its drain, wherein the resistance of the second resistor is greater than that of the first resistor;
a first NMOS transistor that receives the drive signal at its gate;
a second NMOS transistor that receives the drive signal at its gate;
a third resistor that is coupled to the first NMOS transistor at its drain and that is coupled to the first resistor;
a fourth resistor that is coupled to the second NMOS transistor at its drain and that is coupled to the second resistor, wherein the resistance of the third resistor is greater than that of the fourth resistor;
a first output transistor that is coupled to a node between the first and third resistors at its gate; and
a second output transistor that is coupled in parallel with the first output transistor and that is coupled to a node between the second and fourth resistors at its gate.

16. The apparatus of claim 15, wherein the apparatus further comprises:
a first shunt bias circuit that is coupled to the first output; and
a second shunt bias circuit that is coupled to the second output.

17. The apparatus of claim 16, wherein the first and second output transistors are NMOS transistors.

18. The apparatus of claim 17, wherein each composite switch further comprises:
a first inverter that is coupled to the gates of the first and second PMOS transistors; and
a second inverter that is coupled to the gates of the first and second NMOS transistors.

19. The apparatus of claim 18, wherein the apparatus further comprises a composite shunt switch that is coupled between the first and second outputs.

* * * * *